United States Patent
Zhang

(10) Patent No.: US 12,500,153 B2
(45) Date of Patent: Dec. 16, 2025

(54) EXPOSED BONDING PAD OF CHIP PACKAGE AND MANUFACTURING METHOD THEREOF

(71) Applicant: HEFEI SMAT TECHNOLOGY CO., LTD., Hefei (CN)

(72) Inventor: Guangyao Zhang, Hefei (CN)

(73) Assignee: HEFEI SMAT TECHNOLOGY CO., LTD., Hefei (CN)

( * ) Notice: Subject to any disclaimer, the term of this patent is extended or adjusted under 35 U.S.C. 154(b) by 447 days.

(21) Appl. No.: 18/335,291

(22) Filed: Jun. 15, 2023

(65) Prior Publication Data

US 2023/0411261 A1    Dec. 21, 2023

(30) Foreign Application Priority Data

Jun. 16, 2022    (CN) .......................... 202210678917.1

(51) Int. Cl.
*H01L 21/56* (2006.01)
*H01L 21/60* (2006.01)
*H01L 23/498* (2006.01)

(52) U.S. Cl.
CPC ........ *H01L 23/49811* (2013.01); *H01L 21/60* (2021.08); *H01L 2021/60112* (2013.01)

(58) Field of Classification Search
CPC .......................... H01L 23/49811; H01L 21/561
See application file for complete search history.

(56) References Cited

U.S. PATENT DOCUMENTS

| 2010/0127386 A1* | 5/2010 | Meyer-Berg ........ H01L 23/3107 257/E23.068 |
| 2022/0165699 A1* | 5/2022 | Luan ....................... H01L 24/02 |

FOREIGN PATENT DOCUMENTS

| CN | 114783888 A | 7/2022 |
| CN | 115295430 A | 11/2022 |
| CN | 115547852 A | 12/2022 |
| TW | 200709310 A | 3/2007 |

OTHER PUBLICATIONS

First Office Action, including Search Report, for Chinese Patent Application No. 202210678917.1, dated Aug. 2, 2022, 10 pages.

\* cited by examiner

*Primary Examiner* — Michele Fan
(74) *Attorney, Agent, or Firm* — Westman, Champlin & Koehler, P.A.

(57) ABSTRACT

Disclosed is an exposed bonding pad of a chip package and a manufacturing method thereof. The manufacturing method comprises: before the package body is cut, forming a protruding bonding pad on the package body to replace a step of synchronously forming solder pins while forming a conductive layer group in the package body. Cutting grooves is each arranged at a position of a corresponding scribe line to be cut and is each symmetric about the corresponding scribe line. An L-shaped protruding bonding pad wrapping a right-angled edge of the package body is provided is formed inside a corresponding cutting groove instead of an original plate-shaped bonding pad, and process sequence for forming the bonding pad is changed, so that the processing is convenient, tin wicking growth can be obviously observed when soldering the package body, which is convenient for observation and avoids void soldering.

6 Claims, 3 Drawing Sheets

EXPOSED BONDING PAD OF CHIP PACKAGE AND MANUFACTURING METHOD THEREOF

CROSS-REFERENCE TO RELATED APPLICATION

The present disclosure claims priority to the Chinese Patent Application No. 202210678917.1, filed on Jun. 16, 2022, entitled "EXPOSED BONDING PAD OF CHIP PACKAGE AND MANUFACTURING METHOD THEREOF", and published as CN114783888A on Jul. 22, 2022, which is incorporated herein by reference in its entirety in this disclosure.

BACKGROUND OF THE DISCLOSURE

Field of Technology

The present disclosure relates to a technical field of semiconductor packaging, in particular to an exposed bonding pad of a chip package and a manufacturing method thereof.

Description of the Related Art

Integrated circuits are miniature electronic devices or components. By performing appropriate processes, such as lithography process, epitaxy process, diffusion process, physical vapor deposition process, chemical vapor deposition process, wire bonding process and flip chip process, components (e.g., transistors, resistors, capacitors, inductors, etc.) and wires, which are required in a circuit and interconnected together, are fabricated on one or several small semiconductor die or dielectric substrate, and then packaged in a chip shell, so that a microstructure (i.e., a semiconductor package body or a chip) with a required circuit function can be formed. Semiconductor packaging refers to a process to obtain a stand-alone chip by processing on a tested wafer according to a product model and functional requirements. A general process of packaging in our company is as follows: after a wafer from a wafer preceding process is subjected to ball mounting by a ball mounting machine, the wafer is diced into small single dies, which are encapsulated and then subjected to wire redistribution to form circuit connection of a redistribution layer (RDL), then a plastic shell or a ceramic shell is used for packaging and protection to form a chip package body, and finally, a bonding pad is formed, and the bonding pad of the chip is exposed on an outer surface of the package body, so that a subsequent conventional semiconductor processing process, for example, soldering the chip package body onto a solder board, such as a PCB, through the exposed bonding pad, can be performed.

When the chip package body is soldered to the solder board, soldering quality has far-reaching influence, people pay more and more attention to the failure caused by poor semiconductor soldering. This failure is often fatal and irreversible, therefore, in semiconductor packaging technology, after soldering the package body on the PCB with solder, it is necessary to use a microscope to check whether the connection between the package body and the PCB meets the requirements, for example, to check whether the solder sufficiently fills between the PCB and the bonding pad of the package body. If there is solder accumulation at an end, which has the bonding pad, of the package body, it means that the solder between the PCB and the bonding pad of the package body is sufficient, and if there is no solder accumulation at this end, which has the bonding pad, of the package body, it means that the solder between the PCB and the bonding pad of the package body is insufficient, and the connection between the PCB and the bonding pad does not meet the requirements.

When forming the package body of our company, the bonding pad is exposed on the outer surface of the package body, has a low height, and is positioned away from a side edge of the package body by a certain distance, as shown in FIG. 1, when the package body is soldered on the PCB, both the bonding pad and the PCB are subjected to spot tin soldering, then the bonding pad are attached to a corresponding area of the PCB, the material of the bonding pad is generally copper, solder wicking won't occur on bare copper, even if a layer of tin is plated on the surface of the bonding pad in a production process, however, since the bonding pad of a product of our company has low height and is positioned away from the side edge of the package body by a certain distance, tin wicking growth phenomenon may occur, but it is difficult to observe, and tin spillage observation is not obvious. Solder pile cannot be observed from a side, which has the bonding pad, of the package body, thus a problem of void soldering may be caused easily.

SUMMARY

In order to solve the problems in the prior art, an exposed bonding pad of a chip package and a manufacturing method thereof, being convenient for observing tin wicking growth phenomenon, are provided in the present disclosure.

To achieve above objectives, the present disclosure provides a manufacturing method of an exposed bonding pad of a chip package. The manufacturing method comprises following steps:

step 1: forming an inner pin on a wafer, dicing the wafer into separate cells, providing a supporting board, placing the wafer that has passed dicing test onto the supporting board, and performing packaging, after which the inner pin is exposed;

step 2: forming a package body as a whole by packaging, forming a conductive layer group inside the package body at a side, which is close to the inner pin, of the package body, and then removing the supporting board, wherein the conductive layer group is exposed on a surface of the package body;

step 3: cutting the package body at scribe line positions, to form finished products of separate chips;

wherein the manufacturing method further comprises:

between step 2 and step 3, after the package body is formed and before the package body is cut, forming a protruding bonding pad on the package body, to replace a step of synchronously forming a bonding pad while forming the conductive layer group in the package body;

wherein a plurality of cutting grooves are first formed on the package body, the protruding bonding pad is formed on the package body and inside a corresponding one of the cutting grooves, and the protruding bonding pad comprises a side bonding pad and a bottom bonding pad;

step 4: after cutting, plating tin on the side bonding pad of the package body.

In some embodiments, in the steps 1 and 2: after forming the inner pin on the wafer, a first packaging layer is formed for encapsulation, a top surface of the inner pin is exposed by grinding, and the conductive layer group is formed at the position of the inner pin; and then, a second packaging layer is formed for encapsulation, the package body is formed as a whole by use of the first and the second packaging layers which are made of same packaging material; an to-be-connected electrical portion of the conductive layer group is then exposed by grinding, after which the supporting board is removed and the protruding bonding pad which is electrically connected to the conductive layer group is formed by performing electroplating at a position of a corresponding cutting groove.

Further, each one of the plurality of cutting grooves is arranged at a corresponding one of the scribe line positions to be cut on the package body, and is symmetric about the corresponding one of the scribe line positions.

Further, the side bonding pad and the bottom bonding pad are connected to each other and wrap across a right-angled edge between a side surface and a bottom surface of the package body.

Further, the protruding bonding pad is formed by electroplating or laser printing.

Further, the cutting grooves are formed by etching or cutting with a cutting blade.

An exposed bonding pad of a chip package comprises a protruding bonding pad formed by a manufacturing method of the exposed bonding pad of the chip package according to any embodiment of the present disclosure, wherein the protruding bonding pad wraps across a right-angled edge between a side surface and a bottom surface of the package body, and a height of a side bonding pad of the protruding bonding pad is less than a hole depth of a corresponding one of the cutting grooves.

The present disclosure has following advantages: a step of forming a bonding pad of a package body is replaced, instead, after cutting grooves are formed on the package body and before cutting the package body into a finished product of a single chip, a bonding pad is formed at a corresponding one of the cutting grooves, thus, instead of forming a plate-shaped bonding pad which is originally formed only at bottom of the package body, has a certain distance from an edge of the package body and is synchronously formed with a conductive layer group, an L-shaped protruding bonding pad which is connected with a bottom surface and a side surface to wrap across a right-angled edge of the package body, so that when soldering process is performed on the chip package, excess tin material is easy to accumulate at the side bonding pad, tin spillage observation is obvious, tin wicking growth on the side bonding pad is obvious to be observed, which is convenient for observation, thus effectively avoiding void soldering. By plating tin on the side bonding pad, the side bonding pad can be protected, avoiding oxidation, and being beneficial for tin wicking growth. The process, which forms cutting grooves by etching before cutting and then forms the bonding pad, is simple and efficient, no complicated process is needed to be added, and a production workshop can finish the process quickly.

Figure 1:
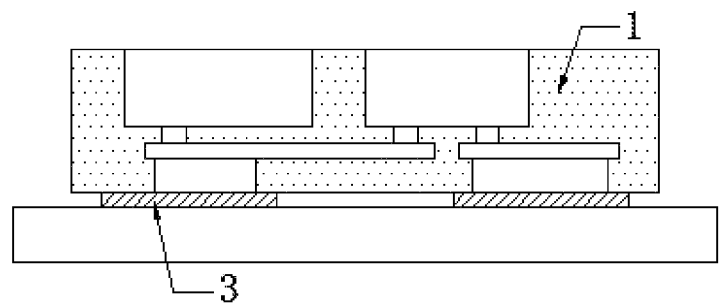
FIG. 1 is a schematic diagram of a bonding pad and a solder board being soldered together according to an un-improved fan-out packaging process implemented by our company.

REFERENCE MARKS IN THE FIGURES package body 1, cutting groove 2, protruding bonding pad 3, side bonding pad 4, bottom bonding pad 5.

DETAILED DESCRIPTION OF THE DISCLOSURE

In the present invention, referred directional terms, such as up, down, left, right, front, back, inside, outside, top surface, bottom surface, side surface, etc., are only directions with reference to the drawings, and the embodiments described below and directional terms used with reference to the drawings are exemplary and are only used for explanation of the present disclosure, and are not to be understood as limiting the present invention. In addition, in the present disclosure, various specific processes and materials are only provided as examples, those of ordinary skill in the art will be aware of applications of other processes and/or usage of other materials.

Figure 2:
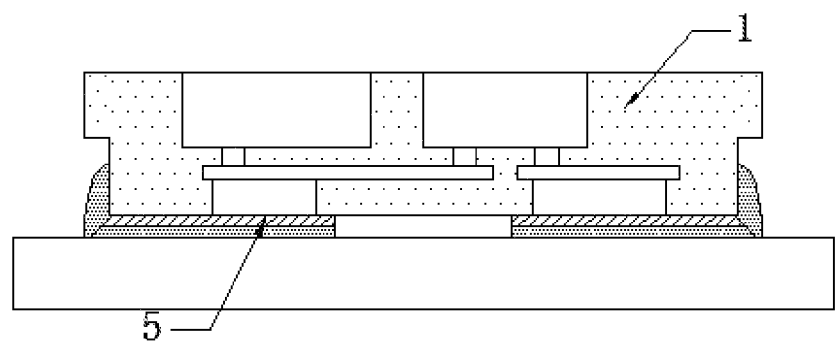
FIG. 2 is a schematic diagram of a bonding pad and a solder board being soldered together according to an improved fan-out packaging process implemented by our company.
Figure 3:
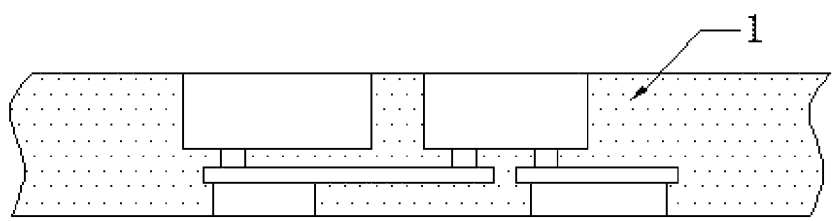
FIG. 3 is a schematic diagram of a step of forming a package body according to an embodiment of a manufacturing method of an exposed bonding pad of a chip package of the present disclosure.
Figure 4:
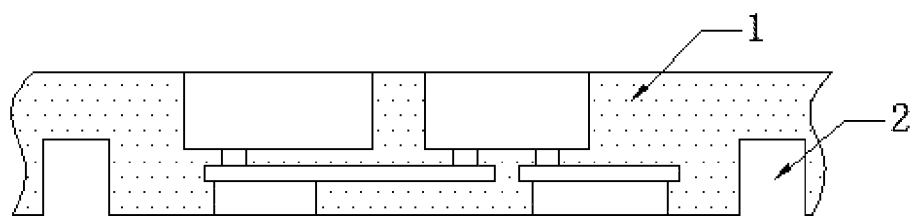
FIG. 4 is a schematic diagram of a step of forming a cutting groove according to an embodiment of a manufacturing method of an exposed bonding pad of a chip package of the present disclosure.
Figure 5:
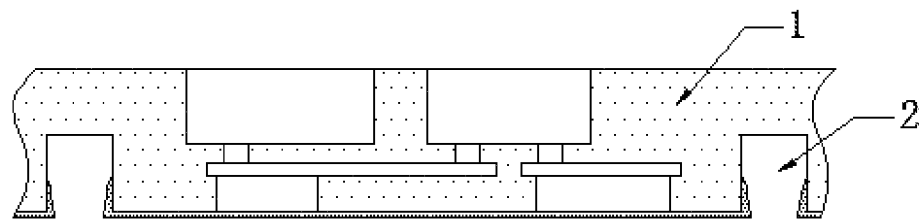
FIG. 5 is a schematic diagram of a step of forming a seed layer according to an embodiment of a manufacturing method of an exposed bonding pad of a chip package of the present disclosure.
Figure 6:
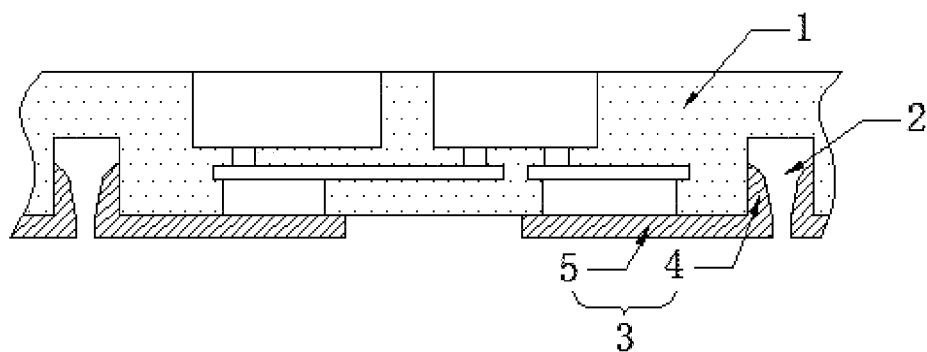
FIG. 6 is a schematic diagram of a step of forming a protruding bonding pad according to an embodiment of a manufacturing method of an exposed bonding pad of a chip package of the present disclosure.
Figure 7:
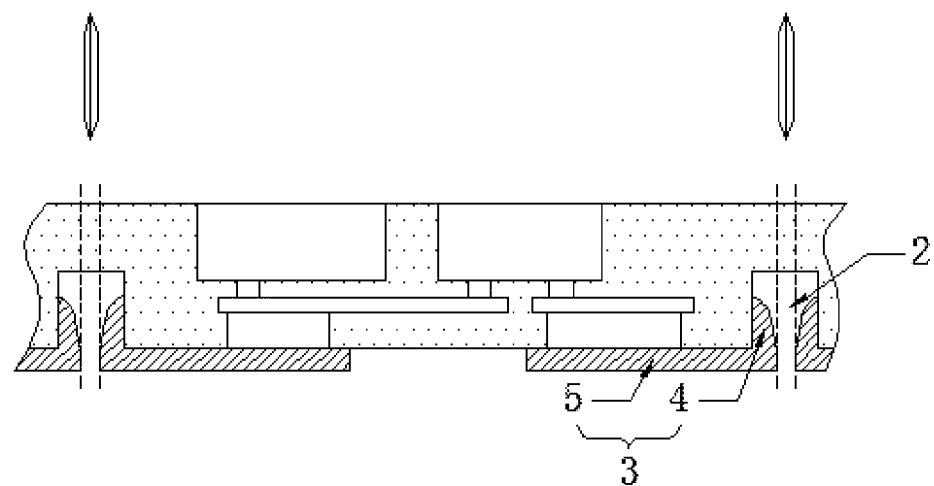
FIG. 7 is a schematic diagram of a step before cutting according to an embodiment of a manufacturing method of an exposed bonding pad of a chip package of the present disclosure.
Figure 8:
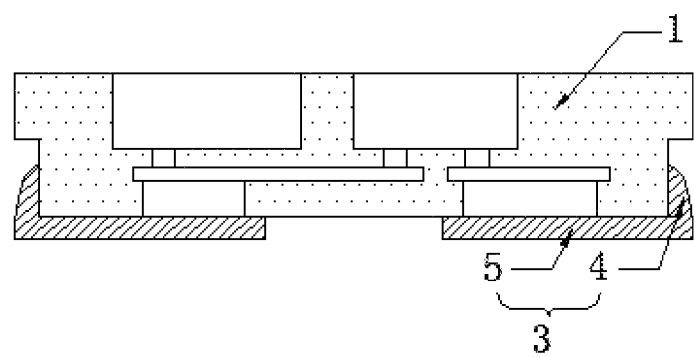
FIG. 8 is a structural schematic diagram of an exposed bonding pad of a chip package according to an embodiment of the present disclosure.

In order to make an objective, a structure and a function of the present disclosure better understood, an exposed bonding pad of a chip package and a manufacturing method of the exposed bonding pad of the chip package provided according to the present disclosure are described in further detail with reference to FIGS. 1-8.

Referring to FIG. 2 and FIGS. 3 to 8, the manufacturing method of the exposed bonding pad of the chip package comprises following steps:

Step S1, using a ball mounting machine to perform ball mounting on a wafer, and dicing into separate dies with a diamond dicing blade, providing a supporting board which can be a commonly used chip supporting board in the field, such as a BT board, an FR-4 board, placing a plurality of wafers (at least two wafers), that have passed a test, on the supporting board after the dicing, performing encapsulating and packaging, wherein EMC material (i.e., epoxy resin molding compound material, epoxy molding compound material) commonly used in the field can be adopted for the encapsulating, EMC material is a powdery molding compound material formed by using epoxy resin as matrix resin, using high-performance phenolic resin as curing agent, adding silicon micro powder and the like as filler, and then mixing with a plurality of additives, has low internal stress and correspondingly low thermal conductivity, and is cured after the encapsulating to ensure adhesive strength, and then a mounting ball can be exposed, that is, surplus molding compound material corresponding to the mounting ball can be removed, the mounting ball can be exposed by many kinds of processes, which can also be commonly used in the field, such as grinding process or drilling process;

Step S2, forming a conductive layer group on a side, which is close to a mounting ball, of the molding compound material, wherein the conductive layer group can be a redistribution layer and a conductive block, the mounting ball can be electrically connected with the redistribution layer, the redistribution layer can be electrically connected with the conductive block, and a process of forming the rewiring layer and the conductive block can be conventional in the field, such as electroplating process, and the supporting board is removed after the electroplating process is completed, so as to form a package body 1 as a whole;

Step S3, forming a plurality of cutting grooves 2 on the package body 1, wherein each cutting groove 2 is arranged at a corresponding one of the scribe line positions to be diced on the package body 1, and is symmetric about the corresponding one of the scribe line positions, and the cutting grooves 2 are formed by etching or cutting with a cutting blade, which are common methods in the field;

Step S4, providing a seed layer to the package body 1 at positions of the cutting grooves 2, wherein the seed layer is, for example, a metal seed layer, which can be formed by a conventional process in the art, such as sputtering process or copper depositing process, a ratio of width to depth of each cutting groove 2 can be lower than 1:1.5, wherein in the present disclosure, if the ratio of width to depth of each cutting groove 2 equal to 1:1.5 is taken as an example, since a hole depth of each cutting groove 2 is very large, but the width is limited, when the metal seed layer is formed in each cutting groove 2 by copper plating, the package body 1 is placed in convective copper plating liquid, which flows at an inner bottom position of each cutting groove 2, an interior of each cutting groove 2 with narrow width and deep depth is hard to be reached, therefore, it is difficult to form the seed layer in a deep interior of each cutting groove 2, so that an electroplating height here can be controlled without any additional process, our company or a packaging factory can completely realize this process using an existing technology, which can not only save production cost, but also ensure normal formation of the side bonding pad 4;

Step S5, performing resist coating, lithography, developing, exposing and etching on the seed layer, then electroplating the protruding bonding pad 3, which comprises a side bonding pad 4 and a bottom bonding pad 5 connected to each other, wherein the side bonding pad 4 and the bottom bonding pad 5 wrap across a part of right-angled edges between the side surface and the bottom surface of the package body 1, thus an L-shaped structure wrapping a right-angled edge is used instead of a plate-shaped exposed bonding pad originally arranged at the bottom of the package body 1, and the side bonding pad 4 and the bottom bonding pad 5 comprised in the protruding bonding pad 3 are all made of metal material, such as copper or titanium;

Step S6, cutting the package body 1 at scribe line positions to split each cutting groove 2 into two parts and form a plurality of finished products, each of which is a single chip, plating tin on the side bonding pad 4 of the package body 1, which is generally referred to as a process called tin immersion (i.e., forming a layer of tin elementary substance on the side bonding pad 4 through chemical reaction, so as to protect the bonding pad with tin for preventing the bonding pad from oxidation;

Step S7, soldering the package body 1 onto the solder board, wherein during the soldering, spot tin soldering is performed on the bottom bonding pad 5, and tin wicking growth can be obvious on the side bonding pad 4, so that it is easy to judge whether the tin soldering property is good or not from the external soldering spot;

then, performing subsequent conventional semiconductor packaging process, to package the single product obtained after cutting.

A step of forming a bonding pad of a package body 1 is replaced, instead, after the cutting grooves 2 are formed on the package body 1 and before cutting the package body 1 into a finished product of a single chip, a bonding pad is formed at a corresponding one of the cutting grooves 2, thus, instead of forming a plate-shaped bonding pad which is originally formed only at bottom of the package body, has a certain distance from an edge of the package body and is synchronously formed with a conductive layer group, an L-shaped protruding bonding pad 3 which is connected with a bottom surface and a side surface to wrap across a right-angled edge of the package body, so that when soldering process is performed on the chip package 1, excess tin material is easy to accumulate at the side bonding pad, tin spillage observation is obvious, tin wicking growth on the side bonding pad is obvious, which is convenient for observation, thus effectively avoiding void soldering. By plating tin on the side bonding pad, the side bonding pad can be protected, avoiding oxidation, and being beneficial for tin wicking growth. The process, which forms the cutting grooves 2 by etching before cutting and then forms the solder, is simple and efficient, no complicated process is needed to be added, and a production workshop can finish the process quickly.

The protruding bonding pad 3 is formed by the manufacturing method of an exposed bonding pad of the chip package. The protruding bonding pad 3 wraps across a right-angled edge between a side surface and a bottom surface of the package body 1. The height of the side bonding pad 4 of the protruding bonding pad 3 is less than the hole depth of the corresponding cutting groove 2. The protruding bonding pad 3 wraps across a right-angled edge of the package body 1 in an L shape, which is convenient for observing tin wicking growth.

It is to be understood that the present disclosure has been described with reference to certain embodiments, and that various changes in the features and embodiments, or equivalent substitutions may be made therein by those skilled in the art without departing from the spirit and scope of the disclosure. In addition, many modifications may be made to adapt a particular situation or material to the teachings of the disclosure without departing from the essential scope thereof. Therefore, it is intended that the disclosure not be limited to the particular embodiment disclosed, but that the disclosure will include all embodiments falling within the scope of the appended claims.

What is claimed is:

1. A manufacturing method of an exposed bonding pad of a chip package, wherein the manufacturing method comprises:
   step 1: forming an inner pin on a wafer, dicing the wafer into separate cells, providing a supporting board, placing the diced wafer that has passed the dicing test onto the supporting board, and performing packaging, after which the inner pin is exposed;
   step 2: forming a package body as a whole by packaging, forming a conductive layer group inside the package body at a side, which is close to the inner pin, of the package body, and then removing the supporting board, wherein the conductive layer group is exposed on a surface of the package body;
   step 3: cutting the package body at scribe line positions, to form finished products of separate chips;
   wherein the manufacturing method further comprises:
   between step 2 and step 3, after the package body is formed and before the package body is cut, forming a protruding bonding pad on the package body, to replace a step of synchronously forming a bonding pad and the conductive layer group in the package body;
   wherein a plurality of cutting grooves are first formed on the package body, the protruding bonding pad is formed on the package body and inside a corresponding one of the cutting grooves, and the protruding bonding pad comprises a side bonding pad and a bottom bonding pad;
   step 4: after cutting, plating tin on the side bonding pad of the package body.

2. The manufacturing method according to claim 1, wherein each one of the plurality of cutting grooves is arranged at a corresponding one of the scribe line positions to be cut on the package body, and is symmetric about that corresponding one of the scribe line positions.

3. The manufacturing method according to claim 2, wherein the side bonding pad and the bottom bonding pad are connected to each other and wrap across a right-angled edge between a side surface and a bottom surface of the package body.

4. The manufacturing method according to claim 3, wherein the protruding bonding pad is formed by electroplating or laser printing.

5. The manufacturing method according to claim 4, wherein the cutting grooves are formed by etching or cutting with a cutting blade.

6. An exposed bonding pad of a chip package, comprising a protruding bonding pad formed by the manufacturing method of the exposed bonding pad of the chip package according to claim 1, wherein the protruding bonding pad wraps across a right-angled edge between a side surface and a bottom surface of the package body, and a height of the side bonding pad of the protruding bonding pad is less than a hole depth of a corresponding one of the cutting grooves.

* * * * *